United States Patent [19]
Saitou et al.

[11] Patent Number: 5,591,359
[45] Date of Patent: Jan. 7, 1997

[54] HIGH-DENSITY ENERGY BEAM WELDING PROCESS AND WELDED STRUCTURE

[75] Inventors: Yuuji Saitou; Minoru Mouko; Suguru Yoshida; Kohki Sugawara, all of Saitama-ken, Japan

[73] Assignee: Honda Giken Kogyo Kabushiki Kaisha, Tokyo, Japan

[21] Appl. No.: 278,896

[22] Filed: Jul. 22, 1994

[30]     Foreign Application Priority Data

Jul. 23, 1993  [JP]  Japan .................................. 5-182313

[51]  Int. Cl.$^6$ .................................................. B23K 26/00
[52]  U.S. Cl. ...................................... 219/121.64; 148/525
[58]  Field of Search ........................ 219/121.63, 121.64, 219/121.13, 121.14; 148/525

[56]               References Cited

U.S. PATENT DOCUMENTS

| | | | |
|---|---|---|---|
| 4,281,235 | 7/1981 | Peloquin | 219/121.64 |
| 4,960,973 | 10/1990 | Fouche et al. | 219/121.64 |
| 5,183,989 | 2/1993 | Sanders et al. | 219/121.14 |

FOREIGN PATENT DOCUMENTS

| | | | |
|---|---|---|---|
| 61-273275 | 12/1986 | Japan | 219/121.14 |
| 62-38781 | 2/1987 | Japan | 219/121.14 |
| 1-127183 | 5/1989 | Japan | 219/121.14 |
| 4-182078 | 6/1992 | Japan | 219/121.14 |

*Primary Examiner*—Geoffrey S. Evans
*Attorney, Agent, or Firm*—Lyon & Lyon

[57]                ABSTRACT

The first and second weld areas of respective first and second metallic workpieces of aluminum or aluminum alloy are held in abutment against each other with a surface of the second metallic workpiece being positioned on a positioning guide of the first metallic workpiece. A recess is defined between the positioning guide and the second metallic workpiece. A high-density energy beam such as a laser beam is applied to the first and second weld areas thereby to develop a molten pool therein that grows toward the positioning guide until metallic oxide films formed on the first and second metallic workpieces are forced into the recess by the molten pool. As no metallic oxide films are present in a weld joint between the first and second metallic workpieces, the resultant welded structure is of a high mechanical strength.

14 Claims, 6 Drawing Sheets

HIGH-DENSITY ENERGY BEAM WELDING PROCESS AND WELDED STRUCTURE

BACKGROUND OF THE INVENTION

1. Field of the Invention

The present invention relates to a high-density energy beam welding process, and more particularly to a method of welding abutting workpieces with a high-density energy beam and a structure welded by a high-density energy beam.

2. Description of the Prior Art

High-density energy beam welding processes include an electron beam welding process, a laser beam welding process, etc.

One known laser beam welding process is disclosed in Japanese laid-open patent publication No. 3-230883.

When metallic members of aluminum or aluminum alloy are welded to each other, a molten pool is formed around a keyhole between the metallic members. The molten pool has an inner region which surrounds the keyhole and in which the molten metal is highly actively agitated, and an outer region which is disposed around the inner region and subjected to less active agitation. When the molten pool grows into a zone where the confronting surfaces of the workpieces contact with each other, aluminum itself is melted as it has a low melting point, but an unmeltable metal oxide film of $Al_2O_3$ having a high melting point is not melted. The portion of the $Al_2O_3$ film which is positioned in the inner region of the molten pool is broken and dispersed by the highly active agitation. However, the portion of the $Al_2O_3$ film which is positioned in the outer region of the molten pool is not destroyed, but remains in the outer region as joined to an unmelted zone of the workpieces. The residual $Al_2O_3$ film is responsible for forming a cavity in the united region which is created when the molten metal is solidified. The cavity that is present in the joint results in a large reduction in the mechanical strength of the welded joint.

SUMMARY OF THE INVENTION

It is therefore an object of the present invention to provide a high-density energy beam welding process which is capable of producing a highly strong welded joint with no unmeltable metal oxide film remaining in the united region.

According to the present invention, there is provided a method of welding metallic workpieces with a high-density energy beam, comprising the steps of bringing weld areas of respective first and second metallic workpieces into abutment against each other, the first metallic workpiece having a portion on which the second metallic workpiece is superimposed, with a recess defined between that portion and the second metallic workpiece, applying a high-density energy beam to the weld areas thereby to form a molten pool therein, and growing the molten pool to force metallic oxide films formed on the first and second metallic workpieces into the recess.

According to the present invention, there is also provided a method of welding metallic workpieces with a high-density energy beam, comprising the steps of providing a first metallic workpiece having a major portion and a positioning guide joined thereto, the major portion having a first weld zone, providing a second metallic workpiece having a second weld zone, bringing the first and second weld zones into abutment against each other, the second metallic workpiece having a surface superimposed on the positioning guide with a recess defined between the positioning guide and the surface of the second metallic workpiece, applying a high-density energy beam to the first and second weld areas thereby to form a molten pool therein, and growing the molten pool toward the positioning guide to force metallic oxide films formed on the first and second metallic workpieces into the recess.

According to the present invention, there is further provided a welded structure comprising a first metallic workpiece having a major portion and a positioning guide joined thereto, the major portion having a first weld zone, and a second metallic workpiece having a second weld zone, the first and second weld zones being held in abutment against each other, the second metallic workpiece having a surface superimposed on the positioning guide with a recess defined between the positioning guide and the second metallic workpiece, the first and second weld zones being united by a welded joint formed therein, from which metallic oxide films formed on the first and second metallic workpieces are forced into the recess.

The above and other objects, features, and advantages of the present invention will become apparent from the following description when taken in conjunction with the accompanying drawings which illustrate preferred embodiments of the present invention by way of example.

DETAILED DESCRIPTION OF THE PREFERRED EMBODIMENTS

Figure 1:
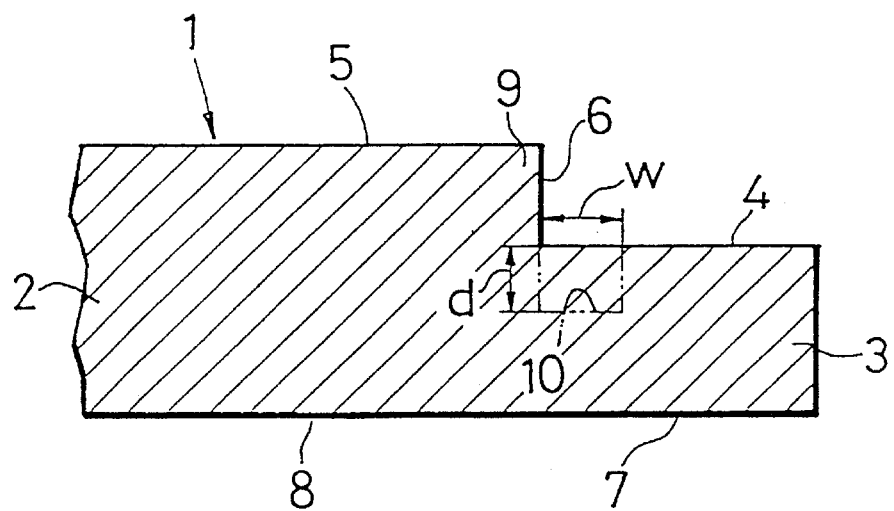
FIG. 1 is a fragmentary cross-sectional view of a workpiece blank made of an aluminum alloy.

As shown in FIG. 1, a workpiece blank 1 made of an aluminum alloy comprises a major thick portion 2 and a shelf portion 3 projecting laterally from a side edge of the major thick portion 2 and thinner than the major thick portion 2. The shelf portion 3 has an upper surface 4 joined through a vertical surface 6 of the side edge of the major thick portion 2 to an upper surface 5 of the major thick portion 2. The shelf portion 3 also has a lower surface 7 joined directly to and lying flush with a lower surface 8 of the major thick portion 2. The side edge of the major thick portion 2 which includes the vertical surface 6 serves as a weld area 9 extending perpendicularly to the sheet of FIG. 1. The shelf portion 3 serves as a positioning guide during a welding process, as described later on.

Figure 2:
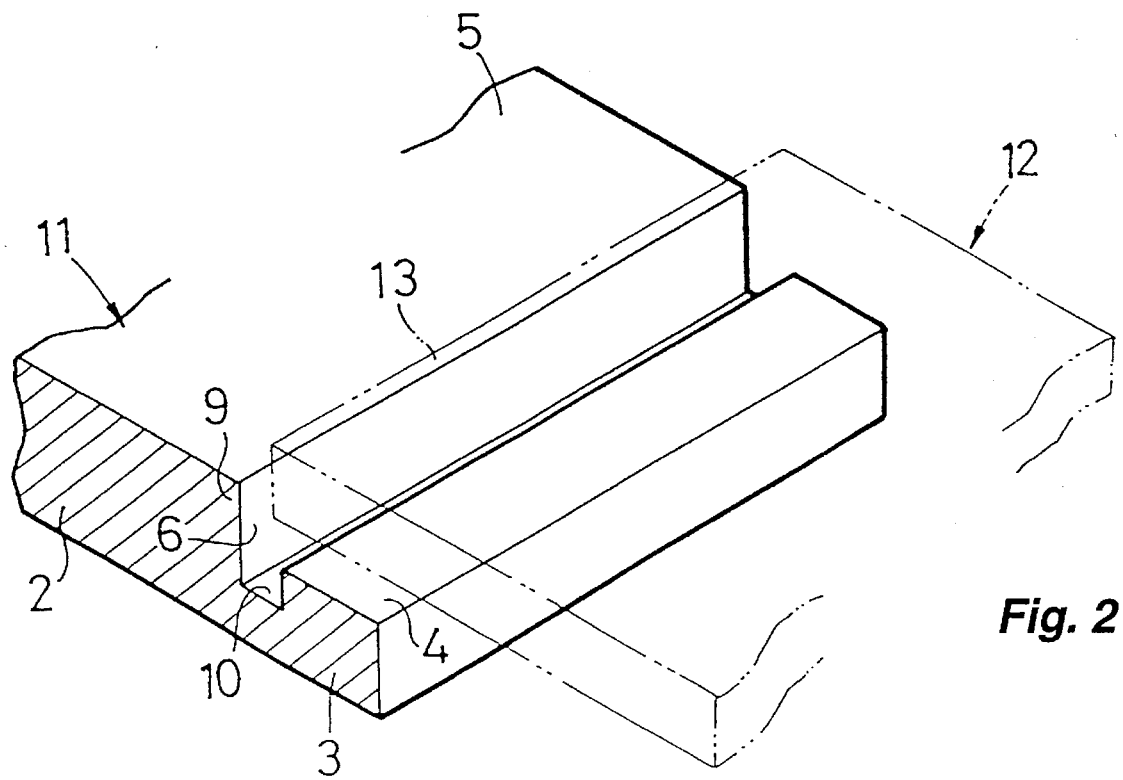
FIG. 2 is a fragmentary perspective view of an aluminum-base workpiece produced from the workpiece blank shown in FIG. 1.
Figure 3:
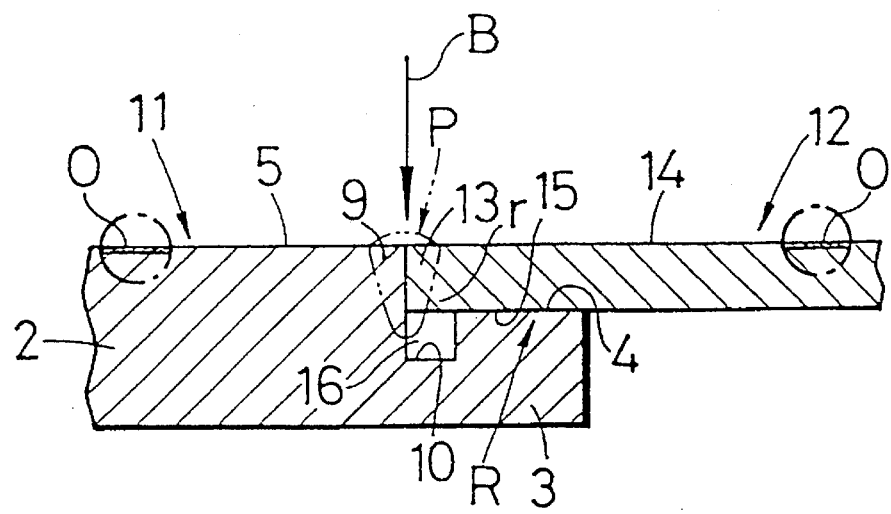
FIG. 3 is a fragmentary cross-sectional view of a first arrangement in which the aluminum-base workpiece shown in FIG. 2 and another aluminum-base workpiece are combined with each other for being welded together.

As indicated by the two-dot-and-dash lines in FIG. 1, a groove 10 is defined in a proximal edge portion of the upper surface 4 of the shelf portion 3 along the vertical surface 6. The groove 10 has an inner vertical surface joined to and lying flush with the vertical surface 6. The groove 10 has a width "w" extending away from the inner vertical surface thereof and a depth "d" extending away from the upper surface 4. The workpiece blank 1 with the groove 10 defined therein serves as an aluminum-base workpiece 11 as shown in FIGS. 2 and 3. The aluminum-base workpiece 11 has entire surfaces covered with an unmeltable $Al_2O_3$ film 0.

As shown in FIGS. 2 and 3, another aluminum-base workpiece 12 which is to be welded to the aluminum-base workpiece 11 is in the form of a thin sheet made of an aluminum alloy. The aluminum-base workpiece 12 has entire surfaces also covered with an unmeltable $Al_2O_3$ film 0.

As shown in FIG. 3, the aluminum-base workpieces 11, 12 are combined with each other for being welded to each other. More specifically, the aluminum-base workpiece 12 has a lower surface 15 near one side edge thereof which is superimposed on the upper surface 4 of the shelf portion 3 of the aluminum-base workpiece 11. The side edge of the aluminum-base workpiece 12 serves as a weld area 13 which is held in abutment against the weld area 9 of the aluminum-base workpiece 11. The aluminum-base workpiece 12 has a thickness which is substantially the same as the height of the vertical surface 6 of the aluminum-base workpiece 11. When the aluminum-base workpieces 11, 12 are combined with each other, therefore, the upper surface 5 of the aluminum-base workpiece 11 lies substantially flush with an upper surface 14 of the aluminum-base workpiece 11. The upper surface 4 of the shelf portion 3 of the aluminum-base workpiece 11 and the lower surface 15 of the aluminum-base workpiece 12 confront each other and are held in contact with each other in a zone R.

In a high-density energy beam welding process such as a laser beam welding process, a laser beam B is applied to the weld areas 9, 13 from a laser beam source (not shown) positioned above the upper surfaces 9, 13, as shown in FIG. 3. The applied laser beam B produces a molten pool P in the weld areas 9, 13, with an unmelted region "r" present around and adjacent to the molten pool P. The unmelted region "r" accommodates therein a recess 16 which is defined by the surfaces of the groove 10, the weld area 13, and associated surfaces.

Figure 4A:
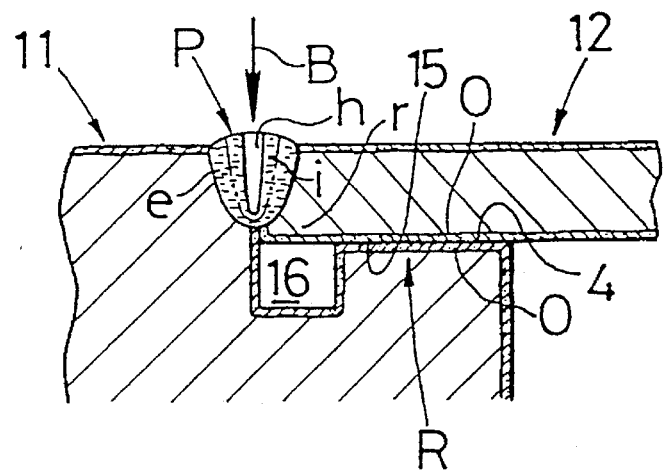
FIGS. 4A, 4B, and 4C are fragmentary cross-sectional views showing the manner in which the aluminum-base workpieces shown in FIG. 3 are welded to each other.

When the laser beam B is applied to the weld areas 9, 13, as shown in FIG. 4A, a keyhole "h" is formed in the weld areas 9, 13 and the molten pool P is produced around the keyhole "h". The molten pool P has an inner region "i" which surrounds the keyhole "h" and in which the molten metal is highly actively agitated, and an outer region "e" which is disposed around the inner region "i" and subjected to less active agitation. The portion of the $Al_2O_3$ film 0 which exists in the weld areas 9, 13 is broken by the formation of the keyhole "h" and the agitating action in the inner region "i", and dispersed in the inner region "i".

Figure 4B:
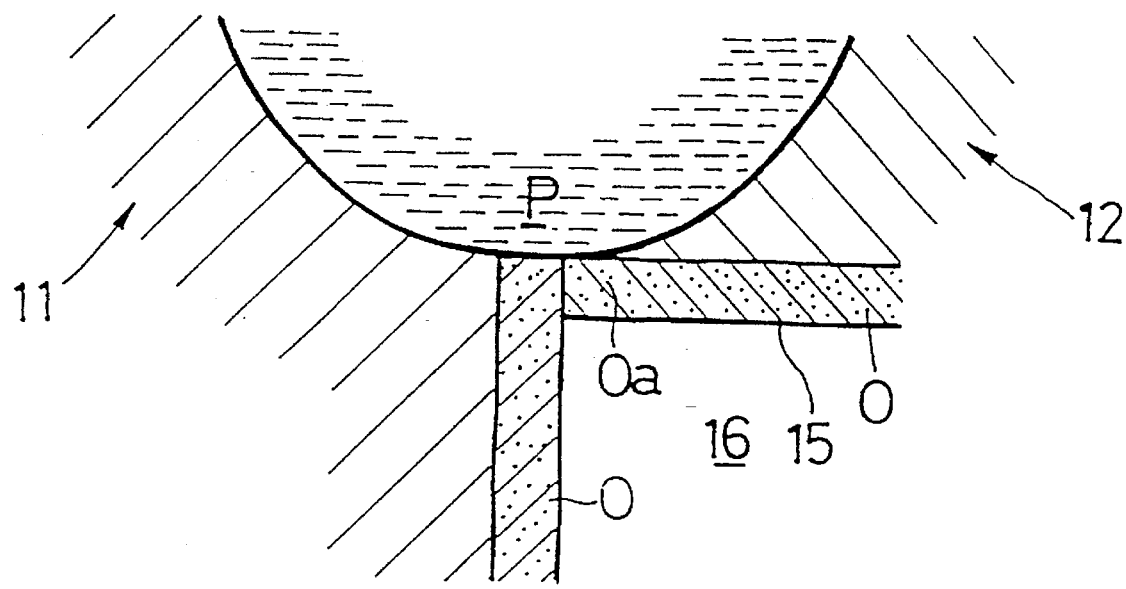

As shown in FIG. 4B, as the molten pool P grows toward the zone R, an unmeltable $Al_2O_3$ film Oa is produced on the aluminum-base workpiece 12, the unmeltable $Al_2O_3$ film Oa being joined to the unmelted region "r" and positioned on an inner wall of the recess 16.

Figure 4C:
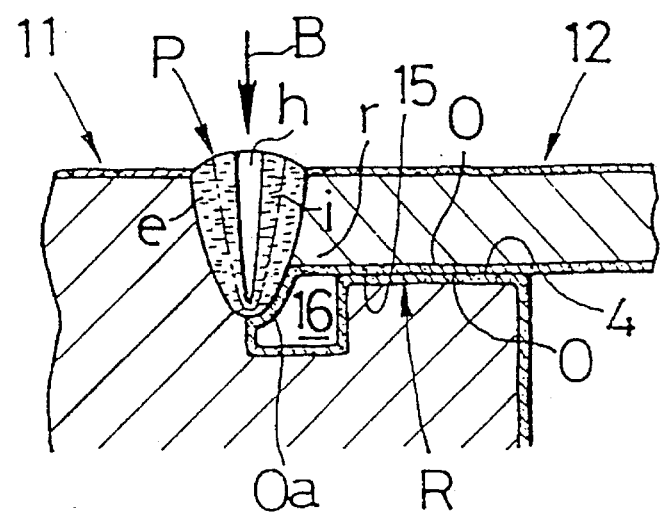

As shown in FIG. 4C, upon further growth of the molten pool P, the unmeltable $Al_2O_3$ film Oa on the aluminum-base workpiece 12 and also an unmeltable $Al_2O_3$ film Oa on the aluminum-base workpiece 11, which is also positioned on an inner wall of the recess 16, are pushed into the recess 16 by the molten pool P.

Figure 5:
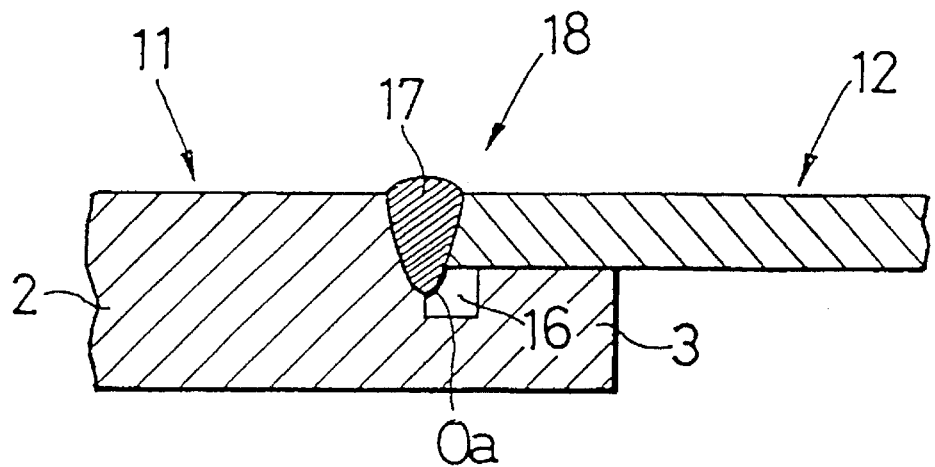
FIG. 5 is an enlarged fragmentary cross-sectional view of a produced welded joint.

When the molten pool P is solidified into a united region 17, a welded joint 18 including the united region 17 is produced as shown in FIG. 5.

Since any unmeltable $Al_2O_3$ film Oa joined to the unmelted region "r" is forced by the molten pool P out of, and hence does not remain trapped in, the united region 17, the produced welded joint 18 is of a high mechanical strength. Furthermore, any increase in the cost of the welding process is small because the recess 16 can easily be formed when the aluminum-base workpieces 11, 12 are combined with each other.

Figure 6:
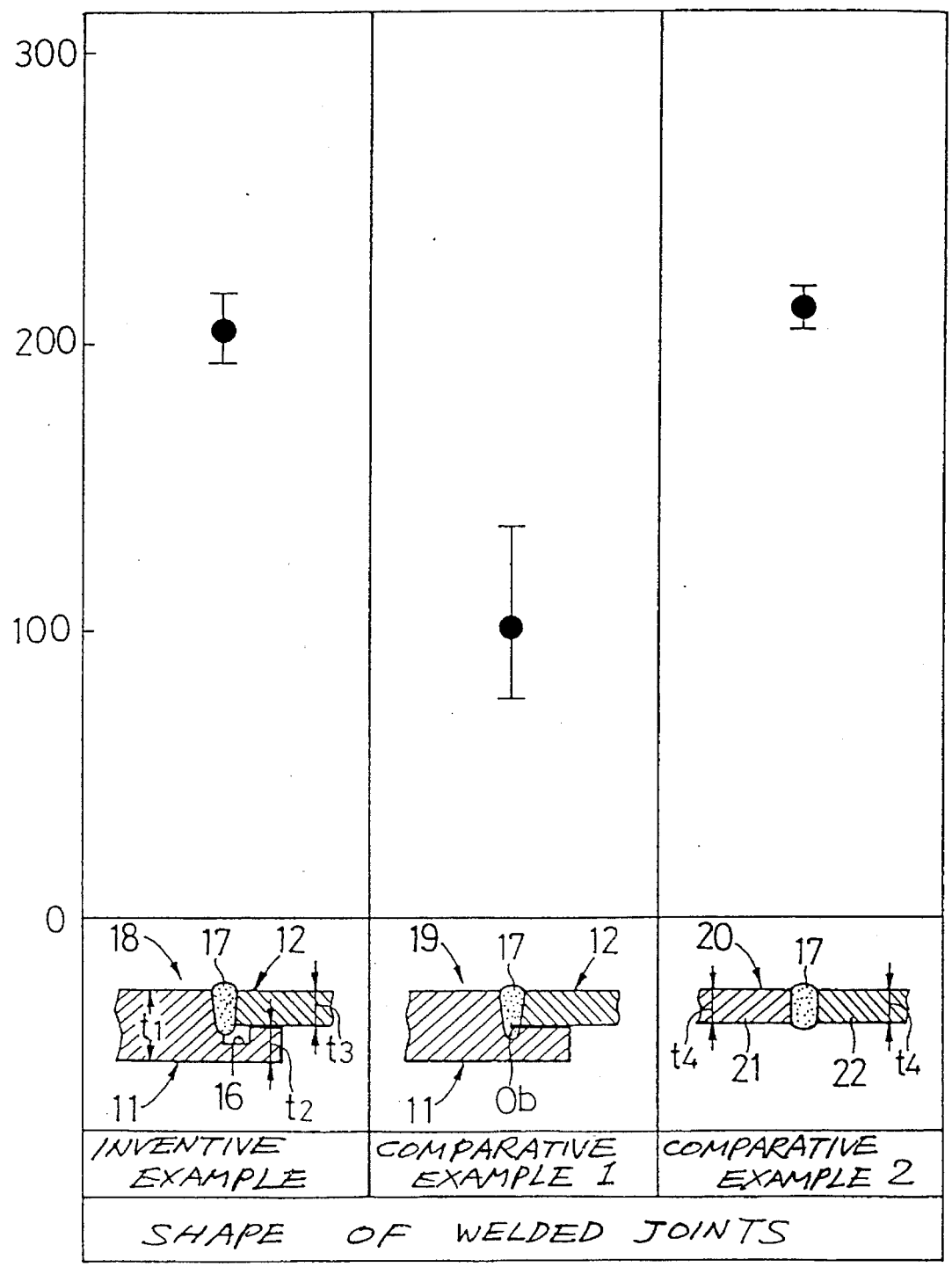
FIG. 6 is a graph showing the tensile strengths of various welded joints.

FIG. 6 shows the shapes of the welded joint 18 according to the Inventive Example shown in FIG. 5 and welded joints 19, 20 produced according to Comparative Examples 1, 2, and also the relationship between the tensile strengths of these welded joints 18, 19, 20.

In the welded joint 18, the aluminum-base workpieces 11, 12 were made of A6NO1S (aluminum alloy). The major thick portion 2 of the aluminum-base workpiece 11 had a thickness $t_1$ of 4 mm. The shelf portion 3 of the aluminum-base workpiece 11 had a thickness $t_2$ of 2 mm. The recess 16 had a depth "d" (see FIG. 1) of 1 mm and a width "w" (see FIG. 1) of 1 mm. The aluminum-base workpiece 12 had a thickness $t_3$ of 2 mm.

The welded joint 19 according to the Comparative Example 1 was the same as the welded joint 18 except that no recess 16 is defined in the welded joint 19.

The welded joint 20 according to the Comparative Example 2 was produced by laser-beam-welding aluminum-base workpieces 21, 22 in the form of thin sheets having the same thickness. The aluminum-base workpieces 21, 22 were made of A6NO1S (aluminum alloy) and had a thickness $t_4$ of 2 mm. In the welded joint 20, the united region 17 reached the lower surfaces of the aluminum-base workpieces 21, 22. Therefore, the welded joint 20 is free from the problem which would otherwise be caused by the $Al_2O_3$ film 0.

The welded joints 18, 19, 20 were produced under the same welding conditions. Specifically, the laser beam output power was 5 kW, and the welding speed was 10 m/min. The filler wire was made of A5356WY (aluminum alloy) and had a diameter of 1.2 mm. The filler wire was supplied at a speed of 2 m/min. The shield gas was a helium gas and supplied at a rate of 30 liters/min.

As can be seen from FIG. 6, the welded joint 18 according to the Inventive Example had a tensile strength of 205 MPa. The welded joint 19 according to the Comparative Example 1 had a tensile strength of 102.5 MPa. Therefore, the tensile strength of the welded joint 18 is twice the tensile strength of the welded joint 19. In the Comparative Example 1, because no recess 16 is present, a residual $Al_2O_3$ film Ob exists in the united region 17, causing a cavity to be formed therein. The welded joint 20 according to the Comparative Example 2 had a tensile strength of 212.5 MPa. Consequently, the welded joint 18 according to the Inventive Example had a tensile strength which is substantially the same as the welded joint 20 according to the Comparative Example 2.

Figure 7:
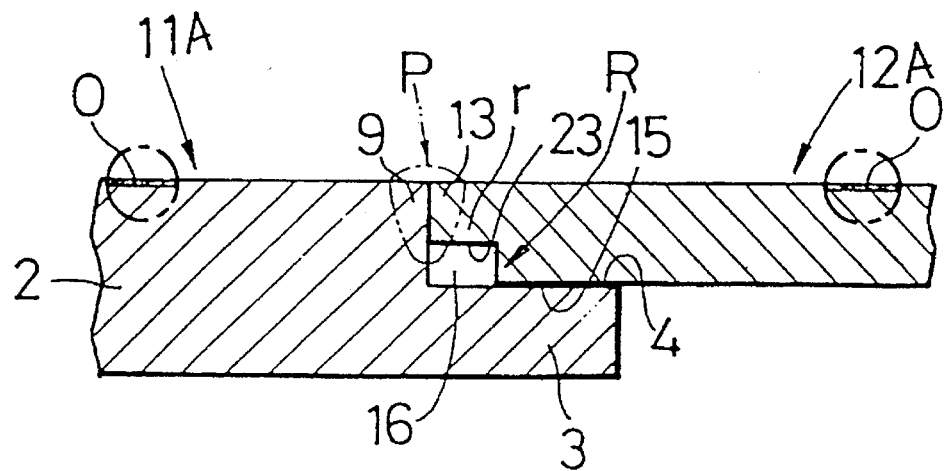
FIG. 7 is a fragmentary cross-sectional view of a second arrangement in which aluminum-base workpieces are combined with each other for being welded together.

FIG. 7 shows a second arrangement in which aluminum-base workpieces are combined with each other for being welded together. In FIG. 7, an aluminum-base workpiece 11A has no recess defined in a shelf portion 3 thereof, and an aluminum-base workpiece 12A combined with the aluminum-base workpiece 11A is thicker than the aluminum-base workpiece 12 shown in FIG. 3. The aluminum-base workpiece 12A has a stepped recess 23 defined in a lower surface 15 thereof and extending along a weld area 13. The stepped recess 23, a major thick portion 2 of the aluminum-base workpiece 11A, and the shelf portion 3 thereof jointly define a recess 16.

Figure 8:
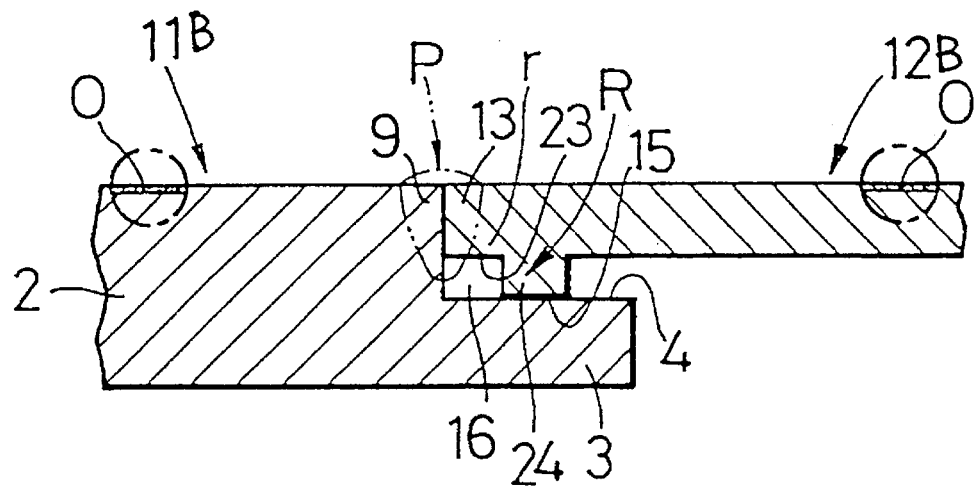
FIG. 8 is a fragmentary cross-sectional view of a third arrangement in which aluminum-base workpieces are combined with each other for being welded together.

FIG. 8 shows a third arrangement in which aluminum-base workpieces are combined with each other for being welded together. In FIG. 8, an aluminum-base workpiece 11B is similar to the aluminum-base workpiece 11A shown in FIG. 7, and an aluminum-base workpiece 12B combined with the aluminum-base workpiece 11B has a stepped recess 23 defined in a lower surface 15 thereof and extending along a weld area 13, and a ridge 24 extending along the stepped recess 23. The portion of the aluminum-base workpiece 12B other than the ridge 24 and the stepped recess 23 is relatively thin, or may be as thin as the portion where the stepped recess 23 is defined. The stepped recess 23, the major thick portion 2 of the aluminum-base workpiece 11B, and the shelf portion 3 thereof jointly define a recess 16.

Figure 9:
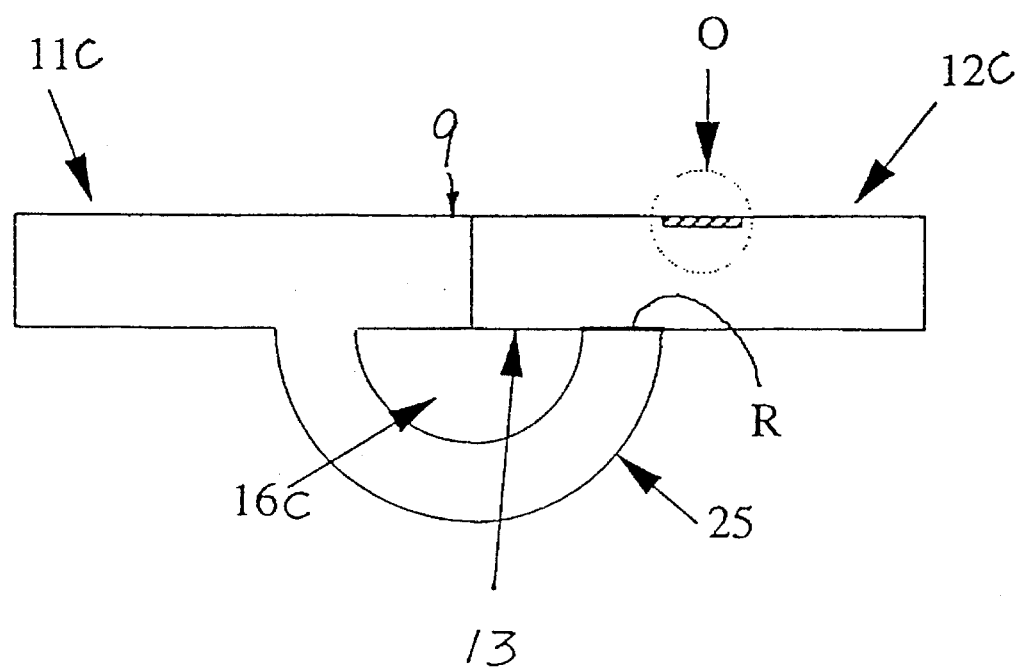
FIG. 9 is a fragmentary cross-sectional view of a fourth arrangement in which aluminum-base workpieces are combined with each other for being welded together.

FIG. 9 shows a fourth arrangement in which aluminum-base workpieces are combined with each other for being welded together. In FIG. 9, two aluminum-base workpieces 11C, 12C have the same thickness. The aluminum-base workpiece 11C has an upwardly open arcuate shelf or arm 25 projecting from a lower surface thereof and having an end abutting against a lower surface of the aluminum-base workpiece 12C. The arcuate arm 25 defines a recess 16C below weld areas 9, 13 of the aluminum-base workpieces 11C, 12C. The aluminum-base workpiece 11C may be produced by extrusion, so that the arcuate arm 25 can easily be formed.

Although certain preferred embodiments of the present invention has been shown and described in detail, it should be understood that various changes and modifications may be made therein without departing from the scope of the appended claims.

What is claimed is:

1. A method of welding metallic workpieces with a high-density energy beam, comprising the steps of:

providing a first metallic workpiece having a major portion and a positioning guide joined thereto, said major portion having a first weld area;

providing a second metallic workpiece having a second weld area;

bringing said first and second weld areas into abutment against each other, said second metallic workpiece having a surface superimposed on said positioning guide with a recess defined in said positioning guide and concealed under said surface of said second metallic workpiece;

applying a high-density energy beam to said first and second weld area, with said recess being unexposed to said high-density energy beam, thereby to form a molten pool in said first and second weld areas; and growing said molten pool toward said positioning guide to force metallic oxide films formed on said first and second metallic workpieces into said recess.

2. A method according to claim 1, wherein each of said first and second metallic workpieces is made of an aluminum alloy, and each of said metallic oxide films comprises an $Al_2O_3$ film.

3. A method according to claim 1, wherein said recess is defined in said positioning guide.

4. A method according to claim 1, wherein said recess is defined in said surface of the second metallic workpiece.

5. A method according to claim 1, wherein said positioning guide comprises a shelf portion projecting from said first metallic workpiece and underlying said second metallic workpiece.

6. A method according to claim 1, wherein said positioning guide comprises an arcuate arm projecting from said first metallic workpiece and underlying said second metallic workpiece.

7. A welded structure comprising:

a first metallic workpiece having a major portion and a positioning guide joined thereto, said major portion having a first weld area; and a second metallic workpiece having a second weld area; said first second weld areas being held in abutment against each other, said second metallic workpiece having a surface superimposed on said positioning guide with a recess defined in said positioning guide and concealed under said surface of said second metallic workpiece, said first and second weld areas being united by a welded joint formed therein by a high-density energy beam applied to said first and second welded areas with said recess being unexposed to said high-density energy beam, whereby metallic oxide films formed on said first and second metallic workpieces are forced from said welded joint into said recess.

8. A welded structure according to claim 7, wherein each of said first and second metallic workpieces is made of an aluminum alloy, and each of said metallic oxide films comprises an $Al_2O_3$ film.

9. A welded structure according to claim 7, wherein said recess is defined in said positioning guide.

10. A welded structure according to claim 7, wherein said recess is defined in said surface of the second metallic workpiece.

11. A welded structure according to claim 7, wherein said positioning guide comprises a shelf portion projecting from said first metallic workpiece and underlying said second metallic workpiece.

12. A welded structure according to claim 7, wherein said positioning guide comprises an arcuate arm projecting from said first metallic workpiece and underlying said second metallic workpiece.

13. A method of welding metallic workpieces with a high-density energy beam, comprising the steps of:

providing a first metallic workpiece having a major portion and a positioning guide joined thereto, said major portion having a first weld area;

providing a second metallic workpiece having a second weld area;

positioning a surface of said second metallic workpiece in superimposed relation to said positioning guide and holding said first and second weld areas in abutment against each other with a recess defined in said positioning guide and concealed under said surface of said second metallic workpiece; and applying a high-density energy beam to said first and second weld areas, with said recess being unexposed to said high-density energy beam, thereby to develop a molten pool in said first and second weld areas and toward said positioning guide until metallic oxide films formed on said first and second metallic workpieces are forced into said recess by said molten pool.

14. A method of welding metallic workpieces with a high-density energy beam, comprising the steps of:

holding first and second weld areas of respective first and second metallic workpieces in abutment against each other while positioning a surface of said second metallic workpiece on a positioning guide of said first metallic workpiece, with a recess defined in said positioning guide and concealed under said surface of said second metallic workpiece; and applying a high-density energy beam to said first and second weld areas, with said recess being unexposed to said high-density energy beam, thereby to develop a molten pool in said first and second weld areas and toward said positioning guide until metallic oxide films formed on said first and second metallic workpieces are forced into said recess by said molten pool.

\* \* \* \* \*